(12) United States Patent
Xue et al.

(10) Patent No.: US 10,784,355 B2
(45) Date of Patent: Sep. 22, 2020

(54) GATE HOLE DEFECT RELIEVING METHOD

(71) Applicant: Wuhan Xinxin Semiconductor Manufacturing Co., Ltd., Hubei (CN)

(72) Inventors: Guangjie Xue, Hubei (CN); Yun Li, Hubei (CN); Jun Zhou, Hubei (CN)

(73) Assignee: Wuhan Xinxin Semiconductor Manufacturing Co., Ltd., Wuhan Hubei (CN)

( * ) Notice: Subject to any disclaimer, the term of this patent is extended or adjusted under 35 U.S.C. 154(b) by 0 days.

(21) Appl. No.: 16/217,526

(22) Filed: Dec. 12, 2018

(65) Prior Publication Data

US 2019/0371612 A1    Dec. 5, 2019

(30) Foreign Application Priority Data

May 31, 2018 (CN) .......................... 2018 1 0556661

(51) Int. Cl.
*H01L 21/00* (2006.01)
*H01L 21/28* (2006.01)
*H01L 21/02* (2006.01)
*H01L 21/3213* (2006.01)
*H01L 27/11521* (2017.01)

(52) U.S. Cl.
CPC .. *H01L 29/40114* (2019.08); *H01L 21/02071* (2013.01); *H01L 21/32139* (2013.01); *H01L 27/11521* (2013.01)

(58) Field of Classification Search
None
See application file for complete search history.

(56) References Cited

U.S. PATENT DOCUMENTS

| | | | | |
|---|---|---|---|---|
| 5,094,967 A | * | 3/1992 | Shinada | H01L 21/82 438/258 |
| 5,851,865 A | * | 12/1998 | Koike | H01L 21/823807 438/217 |
| 6,060,353 A | * | 5/2000 | Koh | H01L 28/91 257/E21.019 |
| 2001/0045597 A1 | * | 11/2001 | Nishinohara | H01L 29/7834 257/329 |
| 2002/0070407 A1 | * | 6/2002 | Kobayashi | H01L 27/115 257/317 |
| 2004/0102047 A1 | * | 5/2004 | Hayami | H01L 21/31138 438/690 |

(Continued)

*Primary Examiner* — Reema Patel
(74) *Attorney, Agent, or Firm* — Muncy, Geissler, Olds & Lowe, P.C.

(57) ABSTRACT

A method for relieving a hole defect of a gate is disclosed, which includes: providing a substrate; forming a polysilicon layer over the substrate; forming a sacrificial oxide layer over a surface, that faces away from the substrate, of the polysilicon layer; forming a patterned photoresist layer over the sacrificial oxide layer; performing ion implantation by using the patterned photoresist layer as a mask; removing the patterned photoresist layer and the sacrificial oxide layer. In the method, before ion implantation, an oxide layer is formed over the surface of the gate, and is used to reduce affinity of the polysilicon and the photoresist layer. Afterwards, the floating gate is cleaned for many times, and hydrofluoric acid of an appropriate amount is added, so as to completely remove the photoresist layer and other residues while cleaning off the sacrificial oxide layer.

7 Claims, 5 Drawing Sheets

(56) References Cited

U.S. PATENT DOCUMENTS

2005/0275069 A1* 12/2005 Haddad ............ H01L 21/76237
                                                    257/629
2012/0058614 A1*  3/2012 Nguyen ............. H01L 21/0206
                                                    438/264
2018/0030313 A1*  2/2018 Tsuchiya .................. C09G 1/02

* cited by examiner

GATE HOLE DEFECT RELIEVING METHOD

CROSS-REFERENCE TO RELATED APPLICATION

This application claims the priority of Chinese patent application number 201810556661.0, filed on May 31, 2018, the entire contents of which are incorporated herein by reference.

TECHNICAL FIELD

The present invention relates to the field of semi-conductors, and in particular, to a method for relieving a hole defect of a gate.

BACKGROUND

In an existing non-volatile flash memory process and logic process, in order to reduce the resistance of a control gate and decrease losses, heavy ion implantation is usually performed on a gate in an N-type region before patterning of the gate. After a large number of ions are implanted into a polysilicon layer, it is difficult to remove a doped photoresist layer because of a strong bonding capacity of the photoresist layer.

As the size of the gate is increasingly reduced, a hard mask process becomes indispensable to the patterning of the gate. However, the residual photoresist incessantly evaporates and grows in the hard mask produced by chemical vapor deposition, thus the thickness of the photoresist is affected. As a result, advanced etching is incurred and thereby a hole defect occurs in a gate, which causes the yield and reliability to reduce.

Therefore, it is in urgent need to provide a hole defect relieving method for a gate so as to solve a hole defect occurring in the gate during etching in the prior art, and to improve the product yield and reliability.

SUMMARY OF THE INVENTION

An objective of the present invention is to provide a hole defect relieving method for a gate so as to solve a hole defect occurring in the gate during etching in the prior art, and to improve the product yield and reliability.

To solve the problem in the prior art, the present invention provides a hole defect relieving method for a gate, which includes the steps of:

providing a substrate forming a polysilicon layer over the substrate;

forming a sacrificial oxide layer over the polysilicon layer;

forming a patterned photoresist layer over the sacrificial oxide layer;

performing an ion implantation by using the patterned photoresist layer as a mask; and removing the patterned photoresist layer and the sacrificial oxide layer.

Alternatively, in the hole defect relieving method for a gate, the sacrificial oxide layer is formed by an ozone process, a chemical vapor deposition process or a furnace tube process.

Alternatively, in the hole defect relieving method for a gate, the sacrificial oxide layer as a thickness of 3 nm to 6 nm.

Alternatively, in the hole defect relieving method for a gate, the ion implantation has a concentration ranging from $10^{14}$- to $10^{15}$ per square centimeter.

Alternatively, in the hole defect relieving method for a gate, the patterned photoresist layer and the sacrificial oxide layer are removed by an ashing process and a wet-cleaning process.

Alternatively, in the hole defect relieving method for a gate, the ashing process includes: carrying out an ashing by using a foaming agent comprising nitrogen and hydrogen; and the wet-cleaning process includes: cleaning a floating gate structure having ions implanted therein by using an hydrofluoric acid; and then cleaning the floating gate structure by successively using a cleanout fluid and a sulfuric acid solution.

Alternatively, in the hole defect relieving method for a gate, after removing the patterned photoresist layer and the sacrificial oxide layer, the method further includes: cleaning the floating gate structure with an ultrasound.

Alternatively, in the hole defect relieving method for a gate, a gate oxide layer is further formed over the substrate, and the polysilicon layer is formed over the gate oxide layer.

Alternatively, in the hole defect relieving method for a gate, after removing the patterned photoresist layer and the sacrificial oxide layer, the method further includes: etching the polysilicon layer to form a gate.

Alternatively, in the hole defect relieving method for a gate, etching the polysilicon layer includes:

forming a mask layer over the polysilicon layer;

coating a second photoresist;

forming a second patterned photoresist layer by photolithography; and successively etching the mask layer and the polysilicon layer with the second patterned photoresist layer serving as a mask so as to form a floating gate.

In the hole defect relieving method for a gate provided by the present invention, before an ion implantation, a floating gate is oxidized so that the sacrificial oxide layer is formed over a surface, that faces away from the substrate, of the polysilicon layer. The sacrificial oxide layer is used to reduce an affinity between the polysilicon layer and the photoresist layer so as to facilitate cleaning off the photoresist layer in the subsequent cleaning process such that a hole defect can be avoided. After ion implantation, the patterned photoresist layer and the sacrificial oxide layer are successively removed, so that no impurity is left in the floating gate structure.

Moreover, during etching for a small-sized gate, the present invention avoids an occurrence of a hole defect caused by incessant evaporation and growth of the residual photoresist in a hard mask. Therefore, the present invention effectively reduces a hole defect from a gate, and improves the product yield and reliability.

In the figures: 1, substrate, 2, gate oxide layer, 3, polysilicon layer, 4, sacrificial oxide layer, and 5, photoresist layer

DETAILED DESCRIPTION

Specific embodiments of the present invention will be described in detail below with reference to the accompanying drawings. Advantages and features of the present invention will be more apparent from the description and appended claims. It should be noted that the accompanying drawings are provided in a very simplified form and not necessarily drawn to scale, with the only intention to facilitate convenience and clarity in explaining the embodiments of the present invention.

In the following description, it should be understood that, when a layer (or film), region, pattern, or structure is referred to as being "over" a substrate, layer (or film), region, and/or pattern, it may be located directly over another layer or substrate, and/or optionally with one or more layers inserted therebetween. In addition, it should be understood that, when a layer is referred to as being "under" another layer, it may be located directly under another layer, and/or optionally with one or more layers inserted therebetween. Reference to "over" and "under" in each layer may be made based on the accompanying drawings.

Figure 1:
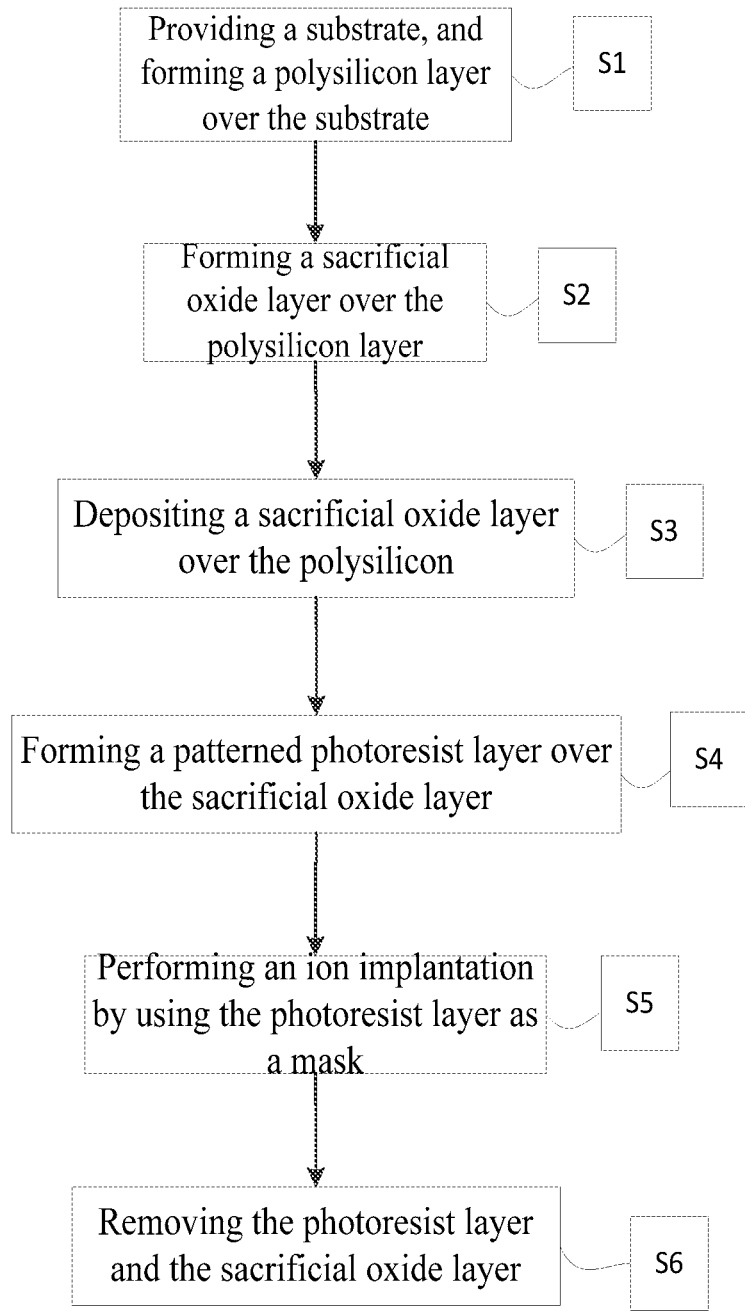
FIG. 1 is a flowchart of a method for forming a floating gate structure in an embodiment of the present invention.
Figure 2:
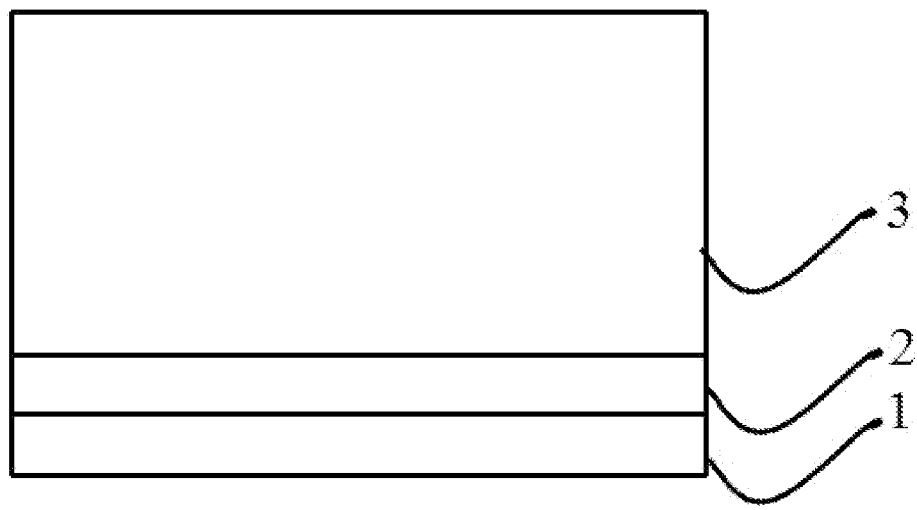
FIG. 2 is a schematic diagram showing deposition of a polysilicon layer over a floating gate structure in the embodiment of the present invention.
Figure 3:
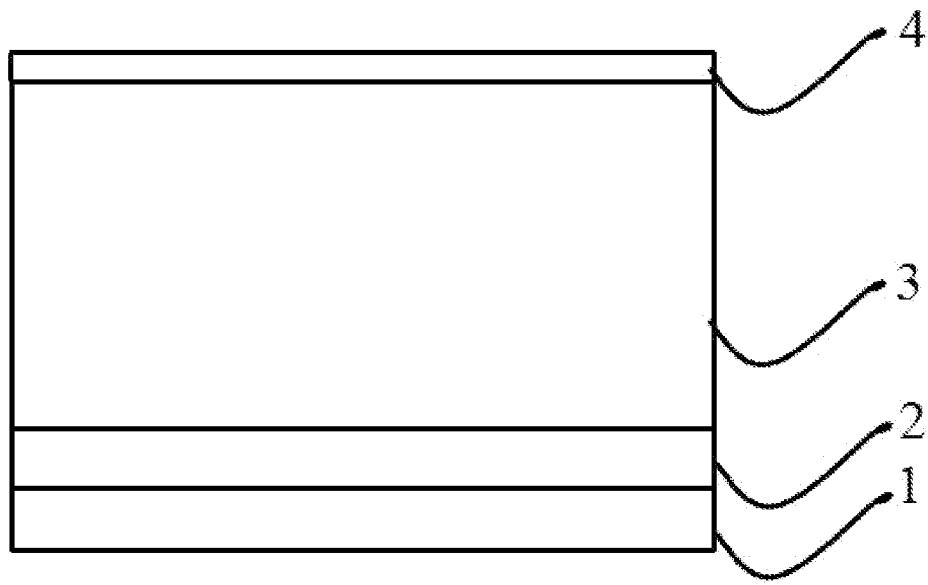
FIG. 3 is a schematic diagram showing deposition of a sacrificial oxide layer over the floating gate structure in the embodiment of the present invention.
Figure 4:
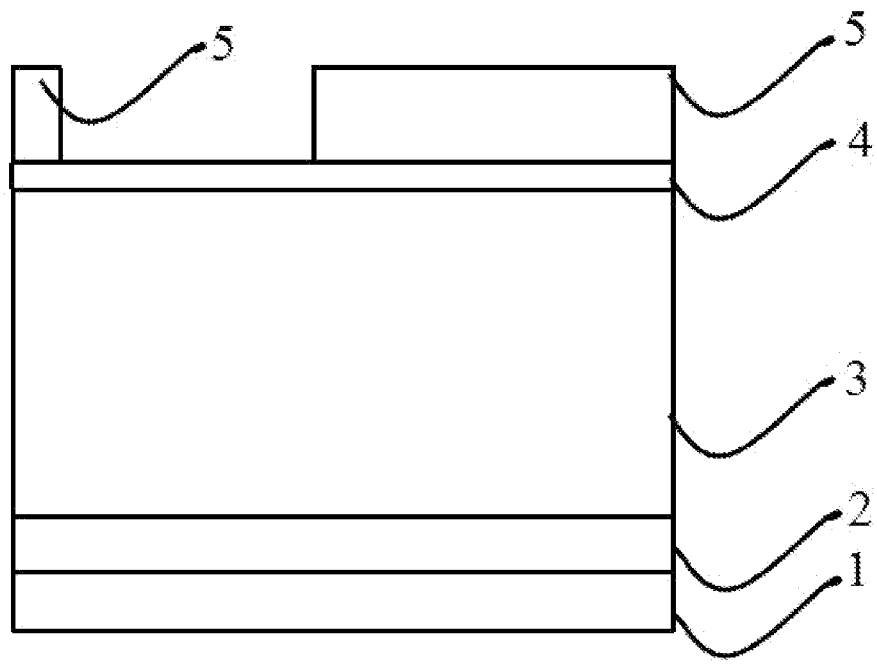
FIG. 4 is a schematic diagram showing forming of a photoresist layer over the floating gate structure in the embodiment of the present invention.
Figure 5:
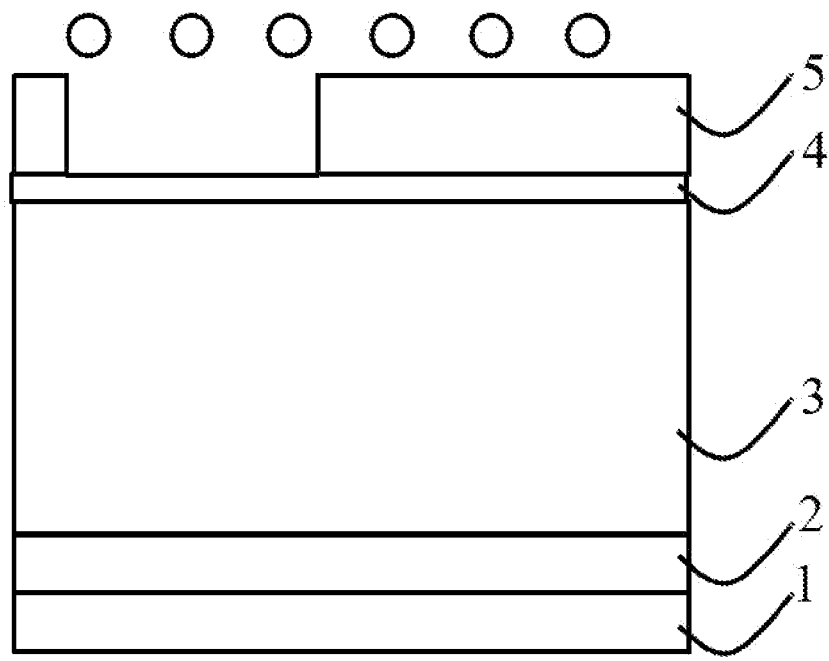
FIG. 5 is a schematic diagram showing ion implantation into the floating gate structure in the embodiment of the present invention.
Figure 6:
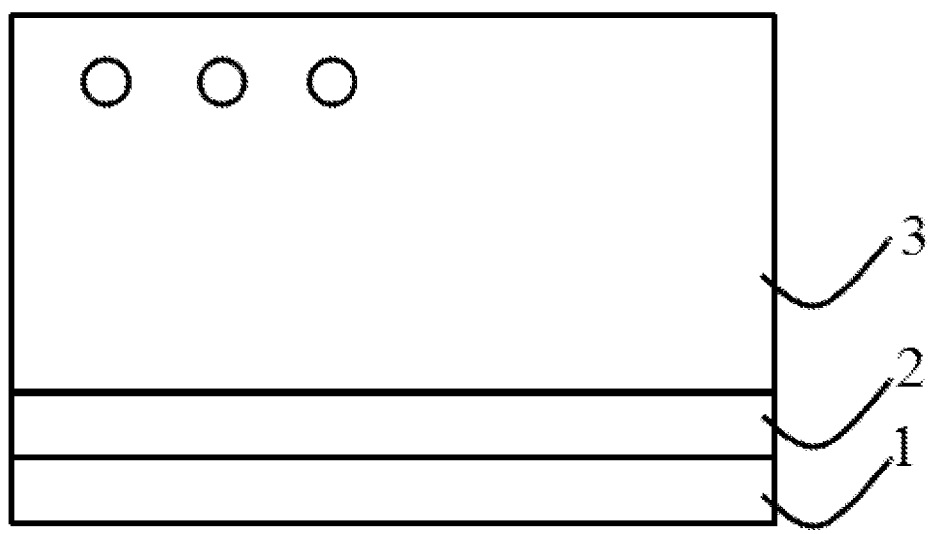
FIG. 6 is a schematic diagram showing that the floating gate structure comprises ions in the embodiment of the present invention.

Referring to FIG. 1 to FIG. 5, FIG. 1 is a flowchart of a method for forming a floating gate structure in an embodiment of the present invention; FIG. 2 is a schematic diagram showing deposition of a polysilicon layer over a floating gate structure in the embodiment of the present invention; FIG. 3 is a schematic diagram showing deposition of a sacrificial oxide layer over the floating gate structure in the embodiment of the present invention; FIG. 4 is a schematic diagram showing forming of a photoresist layer over the floating gate structure in the embodiment of the present invention; FIG. 5 is a schematic diagram showing ion implantation into the floating gate structure according to the embodiment of the present invention; and FIG. 6 is a schematic diagram showing that the floating gate structure comprises ions in the embodiment of the present invention.

As shown in FIG. 1 to FIG. 6, the present invention provides a hole defect relieving method for a gate, which includes the following steps:

S1: providing a substrate 1,

S2: forming a polysilicon layer 3 over the substrate 1;

S3: forming a sacrificial oxide layer 4 over the polysilicon layer 3;

S4: forming a patterned photoresist layer 5 over the sacrificial oxide layer 4;

S5: using the patterned photoresist layer 5 as a mask to perform an ion implantation; and S6: removing the patterned photoresist layer 5 and the sacrificial oxide layer 4.

In the present invention, before ion implantation, a floating gate structure is oxidized so that the sacrificial oxide layer 4 is formed over a surface, that faces away from the substrate 1, of the polysilicon layer 3. The sacrificial oxide layer 4 is used to reduce an affinity between the polysilicon layer 3 and the photoresist layer 5 so as to facilitate cleaning off the photoresist layer 5 in the subsequent cleaning process, such that a hole defect can be avoided. After ion implantation, the patterned photoresist layer 5 and the sacrificial oxide layer 4 are removed, such that no impurity is left in the floating gate structure.

Moreover, during etching for a small-sized gate, the present invention avoids an occurrence of a hole defect caused by incessant evaporation and growth of the residual photoresist in a hard mask. Therefore, the present invention effectively reduces a hole defect from a gate, and improves the product yield and reliability.

Referring to FIG. 2, steps S1 and S2 are performed. The polysilicon layer 3 is formed over the substrate 1. Further, isolation structures are formed and wells are doped in the substrate 1, and a gate oxide layer 2 is deposited over the substrate 1, wherein the polysilicon layer 3 is formed over the gate oxide layer 2. This step aims to make preparation for an ion implantation process, to avoid damaging the substrate 1 in the subsequent process and ensure the product quality.

Afterwards, referring to FIG. 3, step S3 is performed. The sacrificial oxide layer 4 is formed over a surface, that faces away from the substrate 1, of the polysilicon layer 3. Specifically, a method for forming the sacrificial oxide layer 4 includes: forming the sacrificial oxide layer 4 by an ozone process, a chemical vapor deposition process or a furnace tube process, such that a substance on the surface of the polysilicon layer 3 can be fully oxidized. Preferably, the sacrificial oxide layer 4 is silicon dioxide, so that no other impurity ions will be implanted into the floating gate structure.

Preferably, the sacrificial oxide layer 4 has a thickness of 3 nm to 6 nm. In this embodiment, the sacrificial oxide layer 4 may have a thickness of 3, 4, 5, or 6 nm, and is a thin oxide layer. The sacrificial oxide layer 4 not only can protect the floating gate structure and reduce the affinity between the polysilicon layer 3 and the photoresist layer 5, but also can reduce the cleaning workload and realize a thorough cleaning so that no photoresist is left on the surface of the floating gate structure. Thus, the present invention improves the product quality.

Step S4 is performed. As shown in FIG. 4, a patterned photoresist layer 5 is formed over the sacrificial oxide layer 4.

Then, step S5 is performed. As shown in FIG. 5, ion implantation is performed by using the patterned photoresist layer 5 as a mask, where the implanted ions have a concentration ranging from $10^{14}$ to $10^{15}$ per square centimeter. Specifically, a photolithography process is carried out to form the patterned photoresist layer 5, and then ion implantation is performed by using the patterned photoresist layer 5 as a mask at the concentration of $10^{14}$-$10^{15}$ per square centimeter. Due to the pattern, the ions are implanted into the floating gate structure as required, and specifically, are implanted into an N-type region. For regions other than the N-type region, the ions are implanted into the photoresist layer 5. The photoresist layer 5 is used to prevent an error occurring in an ion implantation position or depth. Further, after ion implantation, the adhesion between the photoresist layer 5 and the polysilicon layer 3 may strengthen. In the present invention, the sacrificial oxide layer 4 is provided to prevent the photoresist layer 5 and the polysilicon layer 3 from adhering together.

Preferably, heavy ions are used for implantation in this embodiment. The heavy ions refer to those having nuclei with a mass number greater than 4. The use of the heavy ions in this embodiment can reduce the resistance of a control gate and decrease a current loss as much as possible.

Step S6 is performed subsequently. As shown in FIG. 6, in order that the floating gate structure comprises merely the ions that are implanted into the polysilicon layer 3, the patterned photoresist layer 5 and the sacrificial oxide layer 4 need to be removed by using an ashing process and a wet-cleaning process.

Specifically, the ashing process includes: carrying out an ashing by using a foaming agent comprising nitrogen and hydrogen. The ashing process is usually carried out at a low temperature which is unable to increase the dielectric constant, and preferably, is carried out at room temperature. The ratio of the nitrogen to the hydrogen, the radio-frequency bias power, and process duration are determined according to the extent of polymerization of the polysilicon layer 3 and the photoresist layer 5 as well as their hardening degrees. In this embodiment, a mixed gas of nitrogen and hydrogen is used to perform ashing for the floating gate structure, so as to reduce the extent of polymerization of the polysilicon layer 3, the sacrificial oxide layer 4 and the photoresist layer 5, thus facilitating subsequent cleaning process for the photoresist layer 5, the sacrificial oxide layer 4, and their residues.

Further, the wet-cleaning process includes: first cleaning the floating gate structure having implanted ions by using hydrofluoric acid; and then cleaning the floating gate structure by successively using a cleanout fluid and a sulfuric acid solution. The cleanout fluid is a mixture of an ammonia hydrogen peroxide cleaning solution (SC-1) and a hydrochloric-acid hydrogen peroxide cleaning solution (SC-2). Generally, gaseous or liquid hydrofluoric acid may be used to cleanse the floating gate structure in the present invention, and the liquid hydrofluoric acid is preferably selected, so as to thoroughly remove the sacrificial oxide layer 4 and the residual photoresist from the floating gate structure.

Preferably, an appropriate amount of hydrofluoric acid is added in the cleaning procedure so as to completely remove the patterned photoresist layer 5 while cleaning off the sacrificial oxide layer 4. Thus, during etching for a small-sized gate, the present invention avoids the occurrence of a hole defect caused by incessant evaporation and growth of the residual photoresist in a hard mask. Therefore, the present invention effectively reduces a hole defect from a gate, and improves the product yield and reliability.

Preferably, in the hole defect relieving method for a gate, after removing the patterned photoresist layer 5 and the sacrificial oxide layer 4, the method further includes: cleaning the floating gate structure with an ultrasound. The ultrasonic cleaning is realized mainly by ultrasonic cavitation, which easily occurs at the boundary between the solid and the liquid. Thus an extraordinary cleaning effect can be achieved on an object immersed in a liquid to which the ultrasound is applied. The ultrasound in the present invention is used to clean the acidic liquid off the surface of the floating gate structure, such that the hydrofluoric acid, the mixture of SC-1 and SC-2, and the sulfuric acid solution on the surface of the floating gate structure are cleaned off. Moreover, the ultrasound has a strong ability to penetrate solids, thus is able to penetrate to the other surface of the object to be cleaned and enter all inner cavities, blind holes or slits of the object to be cleaned. The ultrasonic cleaning removes residues attached on the surface of the object to be cleaned so as to achieve a perfect cleaning effect. A lot of grooves or even holes may be produced after the surface of the floating gate structure is cleaned with the cleanout fluid. Therefore, the present invention further uses the ultrasound to clean the grooves or holes, such that the surface of the floating gate structure is cleaned thoroughly, avoiding a small amount of acidic solution or residue from being left in the grooves or holes of the floating gate structure and ensuring the product yield.

Figure 7:
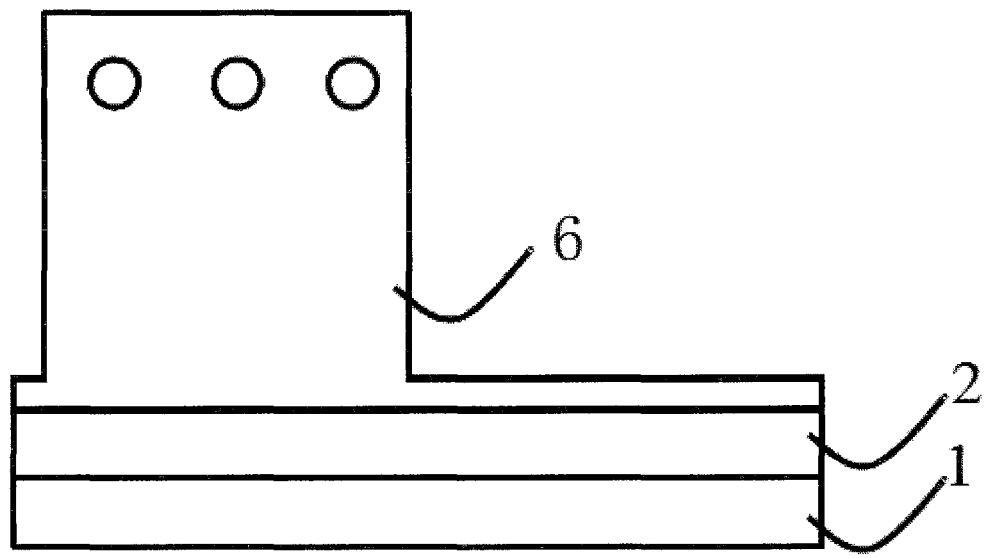
FIG. 7 is a schematic diagram showing that a gate is formed in the embodiment of the present invention.

During forming of a gate, after the step of removing the patterned photoresist layer 5 and the sacrificial oxide layer 4, the method further includes: growing a hard mask by chemical vapor deposition; and then coating the hard mask with a photoresist, and etching the polysilicon layer 3 to form the gate 6, as shown in FIG. 7. Generally, the hard mask is an inorganic film material produced by the chemical vapor deposition, where the chemical vapor deposition is a chemical technique that produces a thin film by initiating a chemical reaction on the surface of the substrate 1 with one or several gas-phase compounds or elementary substances comprising a thin film element.

Figure 8:
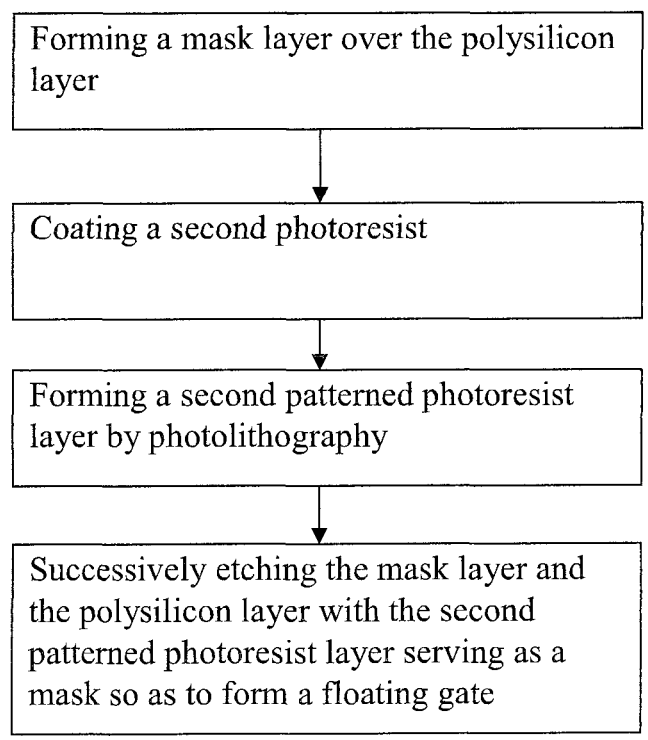
FIG. 8 is a flowchart showing the steps of the method for forming a floating gate structure in an embodiment of the present invention.

As shown in FIG. 8, after the step of removing the patterned photoresist layer 5 and the sacrificial oxide layer 4, the method further includes: forming a mask layer over the polysilicon layer; coating a second photoresist; forming a second patterned photoresist layer by photolithography; and successively etching the mask layer and the polysilicon layer with the second patterned photoresist layer serving as a mask so as to form a floating gate.

Further, the polysilicon layer 3 is located over the gate oxide layer 2, and the hard mask is deposited over the polysilicon layer 3. Then, a patterned photoresist is used to coat the hard mask, and the polysilicon layer 3 is etched by using the patterned photoresist as a mask, so as to finish a graphic etching process for the floating gate. Preferably, trenches are formed in the polysilicon layer 3 during etching, and the etching depth is not greater than the thickness of the gate oxide layer 2.

To sum up, in the hole defect relieving method for a gate provided by the present invention, before ion implantation, a floating gate structure is oxidized so that the sacrificial oxide layer is formed over a surface, that faces away from the substrate, of the polysilicon layer. The sacrificial oxide layer is used to reduce affinity between the polysilicon layer and the photoresist layer, so as to facilitate cleaning off the photoresist layer in the subsequent cleaning process to avoid the occurrence of a hole defect. After ion implantation, the patterned photoresist layer and the sacrificial oxide layer are successively removed by using an ashing process and a wet-cleaning process. The ashing process includes: carrying out ashing by using a foaming agent comprising nitrogen and hydrogen. The wet-cleaning process includes: first cleaning a floating gate structure having implanted ions by using hydrofluoric acid; and then cleaning the floating gate structure by successively using a cleanout fluid and a sulfuric acid solution. In the present invention, the floating gate structure is thoroughly cleaned to remove the patterned photoresist layer and the sacrificial oxide layer, so that no dopant is left in the floating gate structure.

Moreover, during etching for a small-sized gate, the present invention avoids an occurrence of a hole defect caused by incessant evaporation and growth of the residual photoresist in a hard mask. Therefore, the present invention effectively reduces a hole defect from a gate, and improves the product yield and reliability.

The above merely describes some preferred embodiments of the present invention, but does not impose any limitations on the present invention. Any equivalent changes or modifications made by those of ordinary skill in the art based on the above teachings fall within the scope as defined in the appended claims.

What is claimed is:

1. A method for relieving a hole defect of a gate, comprising:

providing a substrate;

forming a polysilicon layer over the substrate;

forming a sacrificial oxide layer over the polysilicon layer;

forming a patterned photoresist layer over the sacrificial oxide layer;

performing an ion implantation by using the patterned photoresist layer as a mask; and removing the patterned photoresist layer and the sacrificial oxide layer, wherein the sacrificial oxide layer has a thickness of 3 nm to 6 nm and is used to reduce an affinity between the polysilicon layer and the photoresist layer so as to facilitate removing the patterned photoresist layer, wherein the patterned photoresist layer and the sacrificial oxide layer are removed by an ashing process and a wet-cleaning process, wherein the ashing process comprises carrying out an ashing by using a foaming agent comprising nitrogen and hydrogen, and wherein the wet-cleaning process comprises removing the patterned photoresist layer and the sacrificial oxide layer by successively using a hydrofluoric acid a cleanout fluid and a sulfuric acid solution.

2. The method of claim 1, wherein the sacrificial oxide layer is formed by an ozone process, a chemical vapor deposition process or a furnace tube process.

3. The method of claim 1, wherein the ion implantation has a concentration ranging from $10^{14}$ to $10^{15}$ per square centimeter.

4. The method of claim 1, wherein after removing the patterned photoresist layer and the sacrificial oxide layer, the method further comprises: cleaning the polysilicon layer with an ultrasound.

5. The method of claim 1, wherein a gate oxide layer is further formed over the substrate, and the polysilicon layer is formed over the gate oxide layer.

6. The method of claim 1, wherein after removing the patterned photoresist layer and the sacrificial oxide layer, the method further comprises: etching the polysilicon layer to form a gate.

7. The method of claim 6, wherein etching the polysilicon layer comprises:

forming a mask layer over the polysilicon layer;

coating a second photoresist;

forming a second patterned photoresist layer by photolithography; and successively etching the mask layer and the polysilicon layer with the second patterned photoresist layer serving as a mask so as to form a floating gate.

* * * * *